（12) United States Patent
Baker

(10) Patent No.: US 6,744,271 B2
(45) Date of Patent: Jun. 1, 2004

(54) INTERNAL GENERATION OF REFERENCE VOLTAGE

(75) Inventor: Ronald N. Baker, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 18 days.

(21) Appl. No.: 10/135,144

(22) Filed: Apr. 30, 2002

(65) Prior Publication Data

US 2004/0041578 A1 Mar. 4, 2004

(51) Int. Cl.[7] .............................................. G01R 31/02
(52) U.S. Cl. .................................... 324/763; 324/158.1
(58) Field of Search ................................ 324/763, 765, 324/158.1; 714/14, 724; 327/407–412; 365/201, 229, 233

(56) References Cited

U.S. PATENT DOCUMENTS

| 5,563,546 | A | * | 10/1996 | Tsukada | 327/408 |
| 5,973,571 | A | * | 10/1999 | Suzuki | 331/17 |
| 6,094,075 | A | * | 7/2000 | Garrett et al. | 327/108 |
| 6,407,571 | B1 | * | 6/2002 | Furuya et al. | 324/765 |
| 6,457,148 | B1 | * | 9/2002 | Yoshiba | 324/765 |
| 6,489,819 | B1 | * | 12/2002 | Kono et al. | 327/141 |

* cited by examiner

Primary Examiner—Kamand Cuneo
Assistant Examiner—Jermele Hollington
(74) Attorney, Agent, or Firm—The Law Office of Thomas R. FitzGerald; Laurence S. Roach, Esq.

(57) ABSTRACT

An integrated circuit (IC) configured for being connected to an external reference voltage uses an IC reference voltage to determine the logic levels of signals applied to the IC. The IC includes an internal reference voltage generator and logic for selecting one of the internal reference voltage and the external reference voltage for use as the IC reference voltage dependent at least in part upon the operational mode of the IC.

25 Claims, 2 Drawing Sheets

INTERNAL GENERATION OF REFERENCE VOLTAGE

FIELD OF THE INVENTION

The present invention relates generally to integrated circuits, and, more particularly, to an integrated circuit that selects between an internal reference voltage and an external reference voltage dependent at least in part upon the mode of operation of the IC.

BACKGROUND OF THE INVENTION

Many integrated circuit interface standards, such as, for example, stub series terminated logic second version (SSTO_2), require the use of a reference voltage pin. During operation of the integrated circuit (IC), all input signals are referenced to the voltage applied to the reference voltage pin, i.e., the reference voltage, in order to determine whether the input signal is a logic high or low level.

The reference voltage must also be applied to the reference voltage pin during testing. Test systems for ICs typically generate the reference voltage in one of several ways, including a driver pin, power supply or a direct current measurement unit. IC test systems generally require a high degree of parallelism, i.e., duplicate tester resources for each and every device under test (DUT). Thus, the method or device used to generate the reference voltage is duplicated for each DUT in order to ensure integrity of the reference voltage signal.

The need for an IC testing system to duplicate the method or device of used to generate the reference voltage for each DUT increases the cost and complexity of the testing system. Further, the need to duplicate the method or device used to generate the reference voltage for each DUT limits the capacity of the testing system, i.e., limits the number of DUTs that can be simultaneously tested by the system.

Therefore, what is needed in the art is a method and apparatus for generating the reference voltage that does not consume testing system resources.

Furthermore, what is needed in the art is a method and apparatus for generating the reference voltage that does not limit the capacity of the testing system.

SUMMARY OF THE INVENTION

The present invention provides an integrated circuit (IC) that selects between an internal reference voltage and an external reference voltage dependent at least in part upon the mode of operation of the IC.

The invention comprises, in one form thereof, an integrated circuit (IC) configured for being connected to an external reference voltage. The IC uses an IC reference voltage to determine the logic levels of signals applied to the IC. The IC includes means for generating an internal reference voltage and means for selecting one of the internal reference voltage and the external reference voltage for use as the IC reference voltage dependent at least in part upon the operational mode of the IC An advantage of the present invention is that the reference voltage is generated without requiring testing system resources.

A further advantage of the present invention is that the testing system capacity is not limited by generation of the reference voltage.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE DRAWINGS

Figure 1:
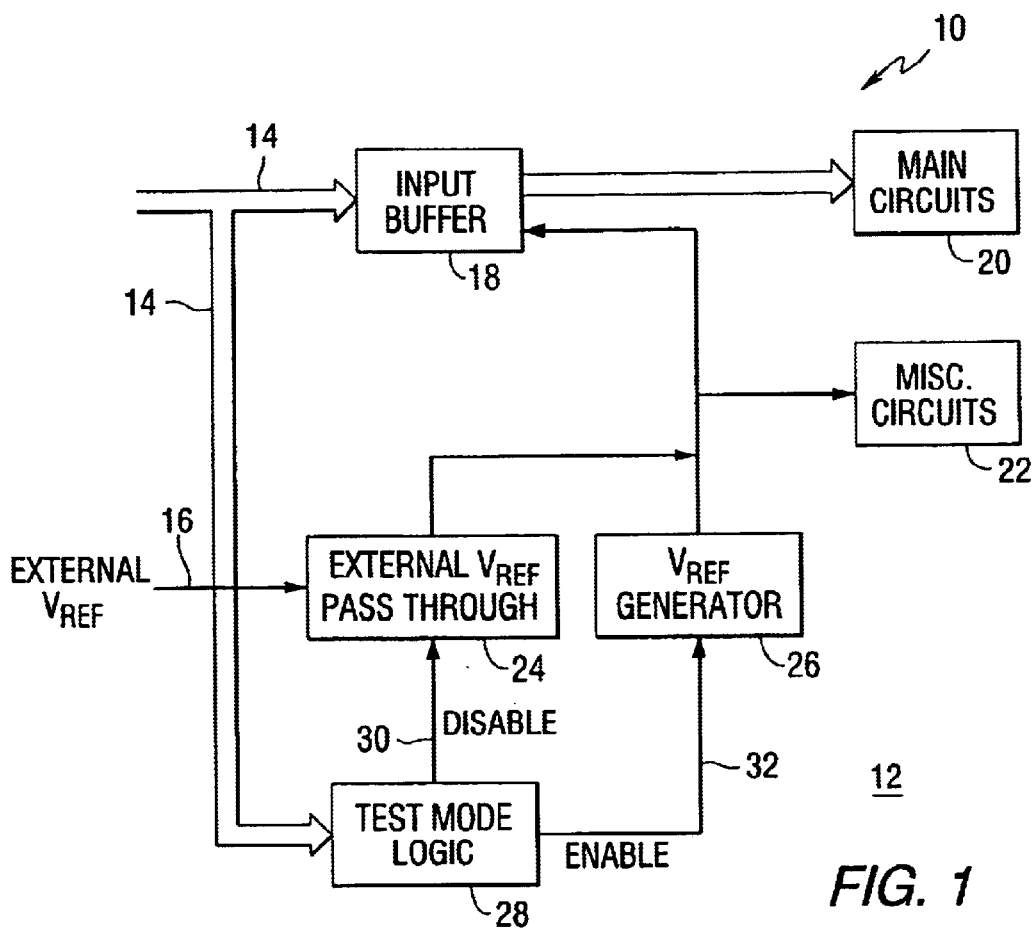
FIG. 1 is a block diagram of one embodiment of an integrated circuit of the present invention.
Figure 2:
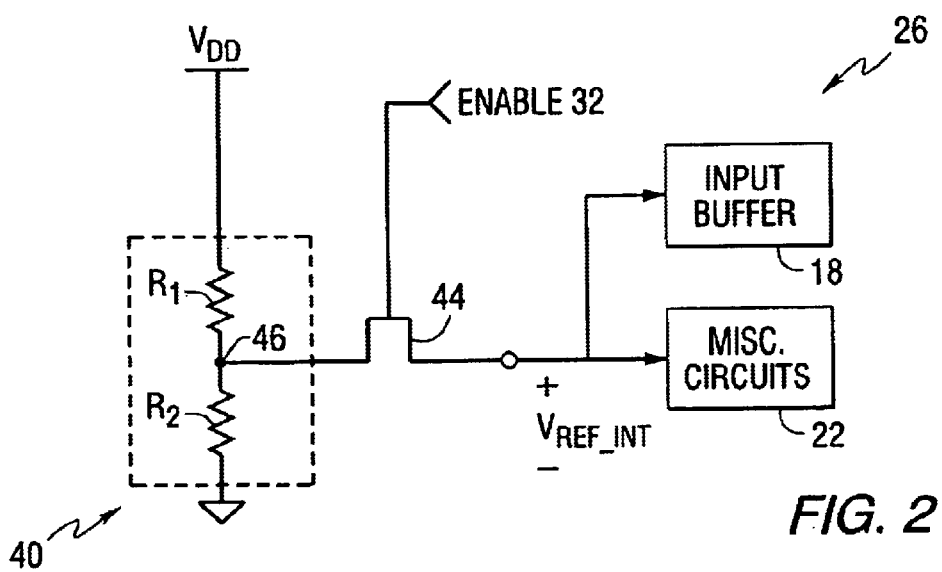
FIG. 2 is a schematic of the internal reference generator of FIG. 1.

Referring now to FIG. 1, a block diagram of an integrated circuit of the present invention is shown. IC 10, such as, for example, a dynamic random access memory chip or any other IC that uses and/or requires a reference voltage input for the purposes described above, is formed on substrate 12. IC 10 includes control bus 14, external reference voltage signal 16, input buffer circuitry 18, main circuits 20, miscellaneous circuitry 22, external reference voltage pass through circuit 24, internal reference voltage generator circuit 26 and test mode logic circuit 28. IC 10 is electrically connected to and powered by supply voltage $V_{DD}$ (FIG. 2).

Control bus 14 electrically connects a plurality of input pins (not shown) of IC 10, which interconnect IC 10 with the outside world, to input buffer circuitry 18 and test mode logic circuit 28. External reference voltage pin 16 is electrically connected to a reference voltage source (not shown), which suppliers an external reference voltage $V_{REF\_EXT}$ to IC 10. Typically, $V_{REF\_EXT}$ is from approximately equal to supply voltage $V_{DD}$ to approximately one-half supply voltage $V_{DD}$. Internal to IC 10, external reference voltage pin 16 is electrically connected to external reference pass through circuit 24.

Input buffer circuitry 18 buffers the input signals received on control bus 14. Main circuits 20, such as, for example, memory cells, perform the main or primary function of IC 10. As such, main circuits 20 can be variously and broadly configured and form no part of the present invention. Similarly, miscellaneous circuitry 22 can be variously and broadly configured, such as, for example, power, interface, and communication circuitry, and form no part of the present invention.

External reference voltage pass through circuit 24, such as, for example, a transistor switch or logic gate, is electrically connected to external reference voltage pin 16, and is thereby electrically connected to and receives external reference voltage $V_{REF\_EXT}$. External reference voltage pass through circuit 24 is also electrically connected to test mode logic circuit 28, input buffer circuitry 18 and miscellaneous circuitry 22. External reference voltage pass through circuit 24 receives disable signal 30 from test mode logic circuit 28. As will be described more particularly hereinafter, external reference voltage pass through circuit 24, dependent at least in part upon disable signal 30, selectively connects or passes $V_{REF\_EXT}$ to input buffer circuitry 18 and miscellaneous circuitry 22.

Internal reference voltage generator circuit 26 is electrically connected to test mode logic circuit 28, to input buffer circuitry 18 and to miscellaneous circuitry 22. Internal reference voltage generator circuit 26 generates internal reference voltage $V_{REF\_INT}$ that is internal to IC 10. $V_{REF\_INT}$ is not accessible outside of IC 10, it is an internal voltage generated by internal reference voltage generator circuit 26. Internal reference voltage generator circuit 26 receives from test mode logic circuit 28 enable signal 32.

Referring now to FIG. 2, an exemplary embodiment of internal reference voltage generator circuit 26 includes voltage divider circuit 40 and transistor 44. Voltage divider circuit 40 includes resistors R1 and R2, with resistor R1 connected between supply voltage $V_{DD}$ of IC 10 and common node 46 and resistor R2 connected between common node 46 and ground potential. The ratio of the resistance values of resistors R1 and R2 determines the value of $V_{REF\_INT}$. $V_{REF\_INT}$ is approximately equal to the voltage present at the source/emitter terminal of transistor 44. More particularly, $V_{REF\_INT}$ is equal to the voltage between common node 46 and ground minus the forward bias voltage drop across transistor 44.

Transistor 44, such as, for example, a p-channel field effect transistor (PFET), has its gate/base terminal electrically connected to enable signal 32, its drain/collector terminal electrically connected common node 46, and its source/emitter terminal electrically connected to input buffer circuitry 18 and main circuits 20. Transistor 44 acts as a switch that selectively connects $V_{REF\_INT}$ to input buffer circuitry 18 and main circuits 20 when enable signal 32 is active.

Test mode logic circuit 28 issues disable signal 30 to external reference voltage pass through circuit 24 and issues enable signal 32 to internal reference voltage generator circuit 26. Test mode logic circuit 28 determines whether IC 10 is being operated in the test mode or normal mode (i.e., non-test mode) of operation. Test mode logic circuit 28 consists of one or more electrically interconnected logic gates that detect a particular combination or series of signals that are placed on control bus 14 and are intended to place IC 10 into the test mode. The actual configuration of test mode logic circuit 28 is dependent upon and will vary according to the particular combination of signals that are used to place IC 10 into the test mode.

In the normal use mode, i.e., non-test mode, IC 10 operates with external reference voltage pass through circuit 24 enabled. More particularly, and as described above, $V_{REF\_EXT}$ is connected to external reference voltage input pin 16. With IC 10 in the non-test mode of operation, each of disable signal 30 and enable signal 32 are made inactive by test mode logic circuit 28. As described above, enable signal 32 is electrically connected to the base or gate of transistor 44 of internal reference voltage generator circuit 26. With enable signal 32 inactive, transistor 44 is essentially an open circuit and $V_{REF\_INT}$ is not connected or passed through to buffer circuitry 18 or miscellaneous circuitry 22. In response to an inactive disable signal 30, external reference voltage pass through circuit 24 connects $V_{REF\_EXT}$ to input buffer circuitry 18 and miscellaneous circuitry 22. Thus, in the normal use mode $V_{REF\_EXT}$ is selected as the reference voltage used by IC 10 to determine the logic level of a given signal.

IC 10 is placed into the test mode by a particular combination or series of signals that are placed on control bus 14. Test mode logic circuit 28 detects the particular combination or series of signals corresponding to the test mode or modes for which it is desired to use the internally generated reference voltage $V_{REF\_INT}$ as the reference voltage for IC 10. Upon detecting the particular combination or series of signals on control bus 14, test mode logic circuit 28 makes disable and enable signals 30 and 32, respectively, active. As described above, disable signal 30 is electrically connected to external reference voltage pass through circuit 24. External reference voltage pass through circuit 24 is disabled by the active disable signal 30. With voltage pass through circuit 24 disable, $V_{REF\_EXT}$ is not connected or passed through to input buffer circuitry 18 nor to miscellaneous circuitry 22. Enable signal 32 is electrically connected to the gate/base of transistor 44. The active enable signal forward biases transistor 44, which connects common node 46 to each of input buffer circuitry 18 and miscellaneous circuitry 22. Thus, in the test mode of operation, $V_{REF\_INT}$ is selected as the reference voltage used by IC 10 to determine the logic level of a given signal.

By internally generating the reference voltage within IC 10, the testing system is no longer required to generate a reference voltage for each DUT. Thus, the testing system is no longer required to include means to generate the reference voltage for each DUT. The cost and complexity of the testing system is thereby reduced and capacity of the testing system increased.

Figure 3:
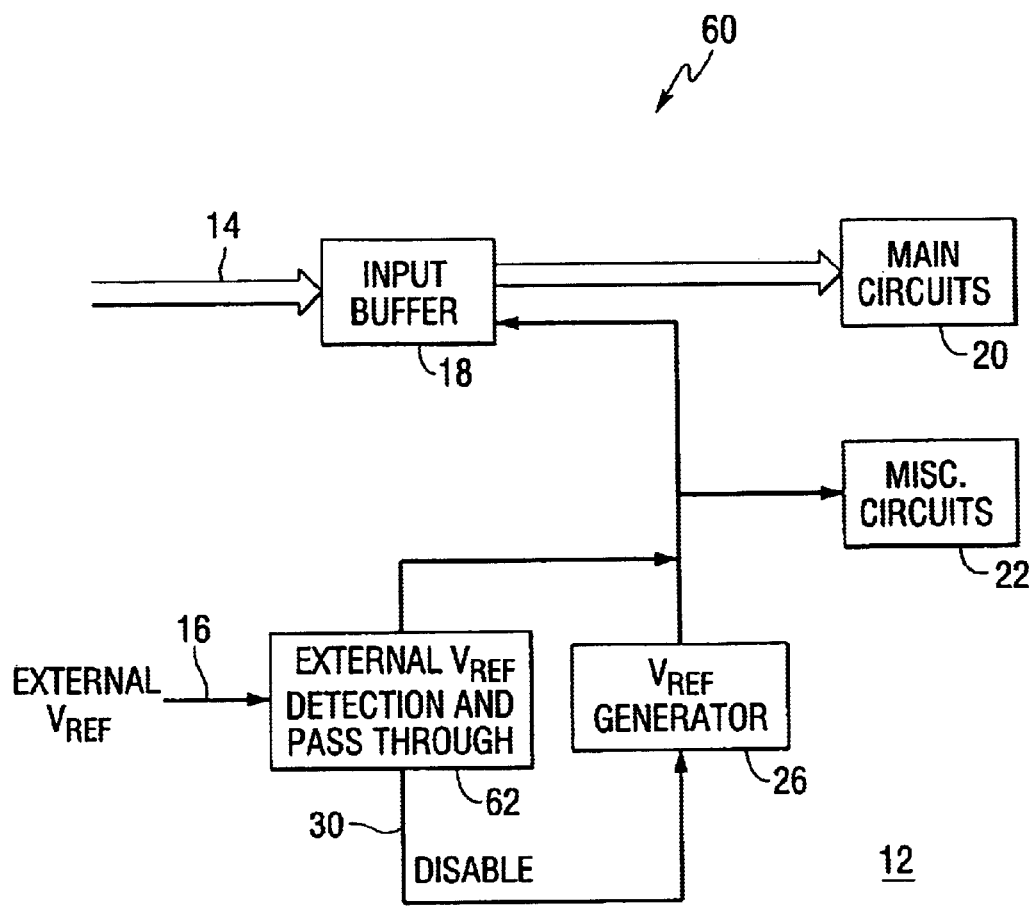
FIG. 3 is a block diagram of a second embodiment of an integrated circuit of the present invention.

Referring now to FIG. 3, a second embodiment of an integrated circuit of the present invention is shown. IC 60 includes many includes circuits and/or components that correspond to IC 10 (FIG. 1) in function and in design, and corresponding reference numbers are used to refer to these corresponding parts. IC 60 is formed on substrate 12, and includes control bus 14, external reference voltage signal 16, input buffer circuitry 18, main circuits 20, miscellaneous circuitry 22, and internal reference voltage generator circuit 26. IC 10 is electrically connected to and powered by supply voltage $V_{DD}$ (FIG. 2).

IC 60 further includes external reference voltage detection and pass through circuit 62. External reference voltage detection and pass through circuit 62 detects whether external reference voltage $V_{REF\_EXT}$ is present at input pin 16 of IC 60, and issues disable signal 30 dependent at least in part upon whether $V_{REF\_EXT}$ is present or absent. When $V_{REF\_EXT}$ is present at input pin 16, external reference voltage detection and pass through circuit 62 makes disable signal 30 active to thereby disable internal reference voltage generator circuit 26. Thus, $V_{REF\_EXT}$ is selected as the reference voltage used by IC 60 to determine the logic levels of other signals. Conversely, when $V_{REF\_EXT}$ is not present at input pin 16 external reference voltage detection and pass through circuit 62 makes disable signal 30 inactive to thereby enable internal reference voltage generator circuit 26. Thus, $V_{REF\_INT}$ is selected as the reference voltage used by IC 60 to determine the logic levels of other signals.

IC 60 is configured with a default mode, such as, for example, to issue an inactive disable signal at power or start up and thereby select $V_{REF\_INT}$ as the default reference voltage used as a reference in determining the logic level of other signals. IC 60 remains in this default mode unless and until an external reference voltage is connected thereto.

In the embodiments shown, IC 10 and IC 60 are configured with $V_{REF\_INT}$ as an internal reference voltage only, i.e., $V_{REF\_INT}$ is not available outside of IC 10. However, it is to be understood that IC 10 can be alternately configured, such as, for example, to include an output pin electrically connected to $V_{REF\_INT}$, to thereby make $V_{REF\_INT}$ accessible externally of IC 10.

In the embodiment shown, test mode logic circuit 28 of IC 10 is configured to issue disable signal 30 and enable signal 32 to indicate whether IC 10 is operating in the test or non-test mode of operation and thereby select one of $V_{REF\_INT}$ and $V_{REF\_EXT}$ as the reference voltage used by IC 10 to determine the logic levels of other signals. However, it is to be understood that IC 10 can be alternately configured, such as, for example, to issue a single test-mode indicating signal that is indicative of whether IC 10 is operating in the test or non-test mode of operation and, dependent at least in part upon that test-mode indicating signal, select one of $V_{REF\_INT}$ and $V_{REF\_EXT}$ as the reference voltage used by IC 10 to determine the logic levels of other signals.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. An integrated circuit (IC), said integrated circuit referencing signals to an IC reference voltage to determine the logic level of those signals, said integrated circuit configured for being electrically connected to an external reference voltage for use as said IC reference voltage, said integrated circuit further having a test mode of operation and a non-test mode of operation, said IC comprising:
    means for generating an internal reference voltage; and
    means for selecting one of said internal reference voltage and the external reference voltage as said IC reference voltage dependent at least in part upon whether said IC is operating in the test mode or non-test mode of operation.

2. The integrated circuit of claim 1, wherein said means for selecting includes:
    an external reference voltage pass through circuit configured for being electrically connected to the external reference voltage; and
    test mode logic circuitry, said test mode logic circuitry detecting whether said IC is to be operated in the test or non-test modes of operation, a test-mode indicating signal being issued by said test mode logic circuitry and being indicative of whether said IC is operating in the test mode of operation, said test-mode indicating signal being received by said external reference voltage pass through circuit and said means for generating an internal reference voltage, one of said internal reference voltage and the external reference voltage being selected as said IC reference voltage dependent at least in part upon said test-mode indicating signal.

3. The integrated circuit of claim 2, wherein said test-mode indicating signal includes a disable signal, said disable signal being activated when said IC is operated in the test mode of operation, said disable signal being received by said external reference voltage pass through circuit to thereby disable said external reference voltage pass through circuit.

4. The integrated circuit of claim 3, wherein said test-mode indicating signal further includes an enable signal, said enable signal being activated when said IC is operated in the test mode of operation, said enable signal being received by said means for generating an internal reference voltage to thereby electrically connect said means for generating an internal reference voltage to said IC.

5. The integrated circuit of claim 4, wherein said test mode logic circuit deactivates said enable and disable signals when said test mode logic circuitry determines said integrated circuit is in the non-test mode of operation.

6. The integrated circuit of claim 4, wherein said means for generating an internal reference voltage comprises:
    a first resistor connected between a supply voltage of said integrated circuit and a first mode;
    a second resistor connected between said first node and ground potential; and
    a transistor switch receiving said enable signal, said transistor switch electrically connecting said first node to said integrated circuit when said enable signal is active to thereby connect the internal reference voltage to said integrated circuit.

7. The integrated circuit of claim 4, wherein said external reference voltage pass through circuit is a transistor switch, said transistor switch receiving said disable signal, said transistor switch electrically interconnecting said external reference voltage and said integrated circuit when said disable signal is inactive to thereby select said external reference voltage as said IC reference voltage.

8. A circuit for selecting an internal reference voltage for use as an IC reference voltage within an integrated circuit, said integrated circuit configured for being electrically connected to the external reference voltage, said integrated circuit including test mode logic circuitry determining whether said integrated circuit is operating in a test mode or non-test mode of operation, said circuit comprising:
    means for generating an internal reference voltage;
    means for selecting the external reference voltage when the integrated circuit is operating in the non-test mode of operation; and
    means for choosing the internal reference voltage when the integrated circuit is operating in the test mode of operation.

9. The circuit of claim 8, wherein said means for generating an internal reference voltage comprises a voltage divider circuit and a switch, said switch connecting said internal reference voltage to the integrated circuit when the IC is in the test mode of operation.

10. The circuit of claim 8, wherein said means for generating, said means for selecting, and said means for choosing are integral and monolithic with a substrate of the integrated circuit.

11. The circuit of claim 8, wherein said means for generating, said means for selecting, and said means for choosing are commonly packaged with the integrated circuit.

12. The circuit of claim 8, wherein said means for selecting comprises:
    an external reference voltage pass through circuit, said external reference voltage pass through circuit receiving a test-mode indicating signal, said test-mode indicating signal indicative of whether the integrated circuit is operating in the test mode of operation, said external reference voltage pass through circuit electrically interconnecting the external reference voltage and the integrated circuit when said test-mode indicating signal indicates the integrated circuit is operating in the non-test mode of operation, and disconnecting the external reference voltage and the integrated circuit when said test-mode indicating signal indicates the integrated circuit is operating in the test mode of operation.

13. The circuit of claim 12, wherein said external reference voltage pass through circuit is a transistor switch electrically interconnected between the external reference voltage and the integrated circuit, said transistor switch receiving said test-mode indicating signal.

14. The circuit of claim 12, wherein said test-mode indicating signal includes a disable signal, said disable signal being active when the integrated circuit is operated in the test mode of operation.

15. The circuit of claim 12, wherein said means for choosing comprises:
a switching circuit, said switching circuit receiving said test-mode indicating signal, said switching circuit electrically interconnecting said internally generated reference voltage and the integrated circuit when said test-mode indicating signal indicates the integrated circuit is operating in the test mode of operation, and disconnecting the internally generated reference voltage and the integrated circuit when said test mode indicating signal indicates the integrated circuit is operating in the non-test mode of operation.

16. The circuit of claim 15, wherein said switching circuit comprises a transistor switch.

17. The circuit of claim 15, wherein said test-mode indicating signal includes an enable signal, said enable signal being active when the integrated circuit is operated in the test mode of operation.

18. An integrated circuit, said integrated circuit (IC) referencing signals to an IC reference voltage to determine the logic level of those signals, said integrated circuit configured for being electrically connected to an external reference voltage for use as said IC reference voltage, said IC comprising:
means for generating an internal reference voltage; and
means for detecting whether the external reference voltage is connected to said IC, said means for detecting selecting the external reference voltage for use as the IC reference voltage when the external reference voltage is connected to said IC, said means for detecting selecting said means for generating an internal reference voltage as the source for the IC reference voltage when the external reference voltage is not connected to said IC.

19. The integrated circuit of claim 18, wherein said means for detecting issues a disable signal, said disable signal being received by said means for generating an internal reference voltage, said disable signal being active and disabling said means for generating an internal reference voltage when the external reference voltage is connected to said IC, said disable signal being inactive and enabling said means for generating an internal reference voltage when the external reference voltage is not connected to said IC.

20. A method for selecting between an external and an internal reference voltage for use as the reference voltage of an integrated circuit, said integrated circuit having a test mode and non-test mode of operation, said method comprising:

generating an internal reference voltage;
detecting whether the integrated circuit is operating in the test mode or non-test mode of operation;
selecting the external reference voltage as the reference voltage during non-test mode operation of the integrated circuit; and
choosing the internally generated reference voltage as the reference voltage during test mode operation.

21. The method of claim 20, wherein said detecting step comprises activating as least one test-mode indicating signal when the integrated circuit is operating in the test mode.

22. The method of claim 20, wherein said selecting step comprises electrically interconnecting the external reference voltage and the integrated circuit dependent at least in part upon said at least one test-mode indicating signal being inactive.

23. The method of claim 20, wherein said choosing step comprises electrically interconnecting the internally generated reference voltage and the integrated circuit dependent at least in part upon said at least one test-mode indicating signal being activate.

24. The method of claim 20, wherein said at least one test-mode indicating signal comprises an enable signal and a disable signal, said enable signal and said disable signal being active when the integrated circuit is operating in the test mode of operation and being inactive when the integrated circuit is operating in the non-test mode of operation.

25. An integrated circuit (IC), said integrated circuit referencing signals to an IC reference voltage to determine the logic level of those signals, said IC reference voltage having a substantially constant voltage level with respect to time, said integrated circuit configured for being electrically connected to an external reference voltage having a substantially constant voltage level with respect to time for use as said IC reference voltage, said integrated circuit further having a test mode of operation and a non-test mode of operation, said IC comprising:
means for generating an internal reference voltage having a substantially constant voltage level with respect to time; and
means for selecting one of said internal reference voltage and the external reference voltage as said IC reference voltage dependent at least in part upon whether said IC is operating in the test mode or non-test mode of operation.

* * * * *